United States Patent [19]

Kobayashi et al.

[11] 4,210,805

[45] Jul. 1, 1980

[54] SEMICONDUCTOR RADIATION DETECTOR

[75] Inventors: Tetsuji Kobayashi; Tohru Sugita, both of Yokohama; Noboru Matsuo, Nagasaki, all of Japan

[73] Assignee: Tokyo Shibaura Electric Company, Limited, Kawasaki, Japan

[21] Appl. No.: 877,942

[22] Filed: Feb. 15, 1978

[30] Foreign Application Priority Data

| Feb. 17, 1977 | [JP] | Japan | 52-16375 |
| Feb. 21, 1977 | [JP] | Japan | 52-17951 |
| Feb. 24, 1977 | [JP] | Japan | 52-19526 |
| Feb. 24, 1977 | [JP] | Japan | 52-19527 |
| Feb. 24, 1977 | [JP] | Japan | 52-19528 |
| May 19, 1977 | [JP] | Japan | 52-58074 |

[51] Int. Cl.² .............................................. G01T 1/22
[52] U.S. Cl. ................................................... 250/370
[58] Field of Search .................... 250/370; 357/29, 30, 357/74

[56] References Cited

U.S. PATENT DOCUMENTS

| 4,047,037 | 9/1977 | Schlosser et al. | 250/370 |
| 4,058,729 | 11/1977 | Sher | 250/370 |
| 4,122,345 | 10/1978 | Rougeot | 250/370 |

*Primary Examiner*—Davis L. Willis
*Attorney, Agent, or Firm*—Oblon, Fisher, Spivak, McClelland & Maier

[57] ABSTRACT

A radiation detector includes a detection element having a single crystal silicon substrate with an impurity concentration of less than $1 \times 10^{14}$ cm$^{-3}$, a metal layer formed on one surface of the substrate to form a surface barrier therebetween and an electrode layer mounted on the opposite surface of the substrate. Between the metal layer and electrode layer there is not applied a bias.

13 Claims, 28 Drawing Figures

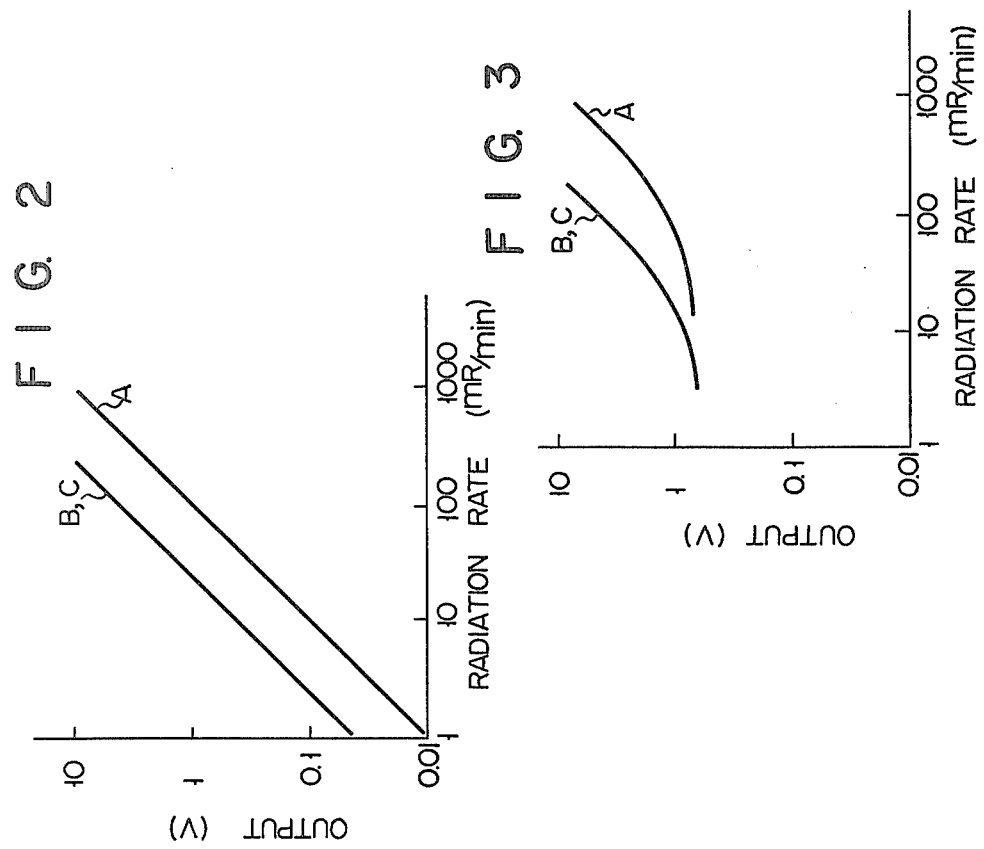
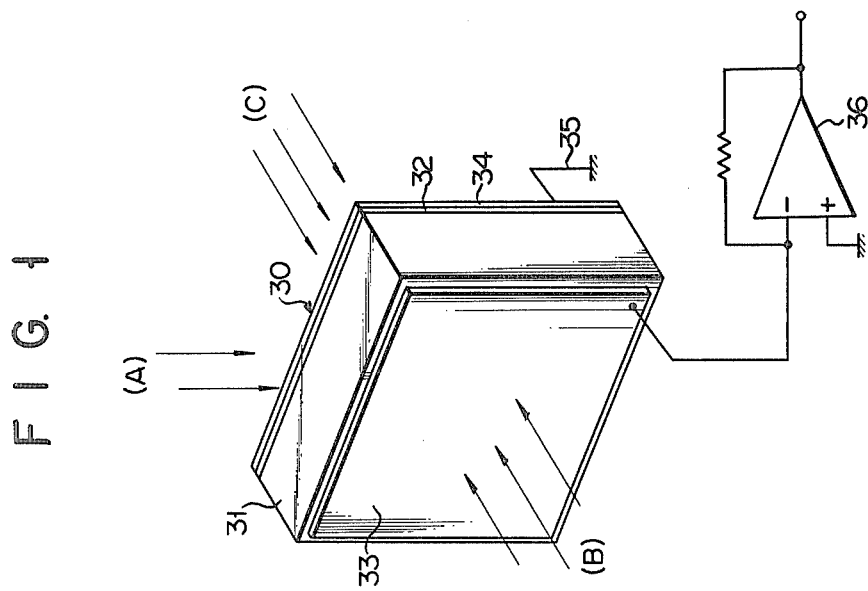

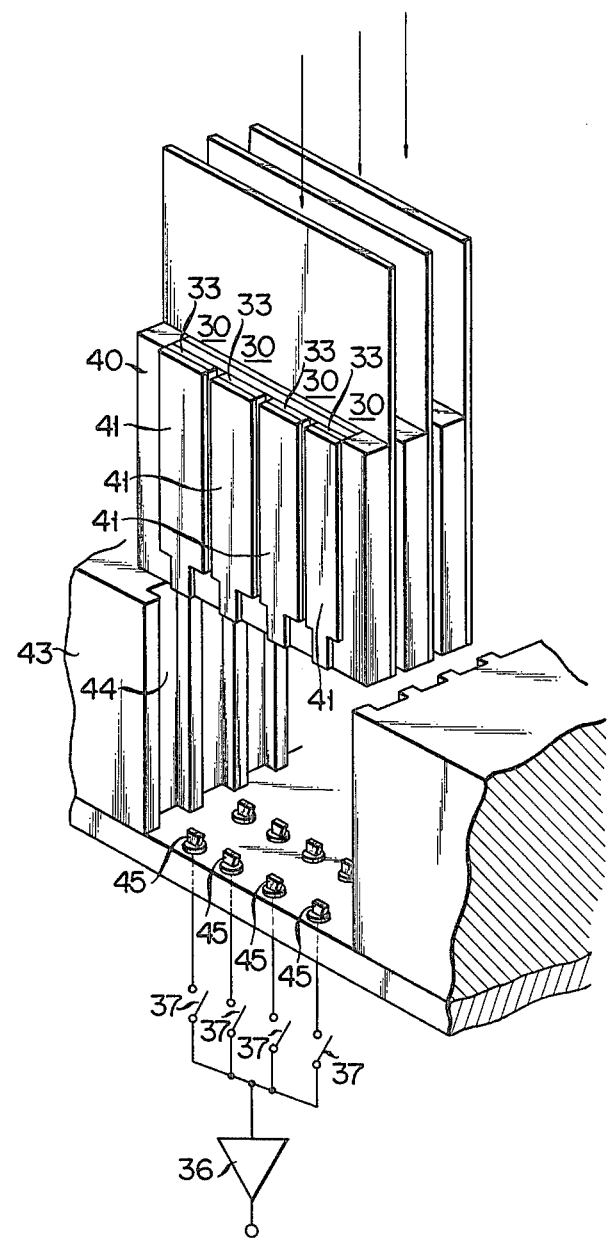
F I G. 27

SEMICONDUCTOR RADIATION DETECTOR

This invention relates to a semiconductor radiation detector and in particular to a silicon substrate type detection device for detecting radiations such as X-rays or γ-rays.

In the past, an ionization chamber type detector and scintillator type photoelectromultiplier detector have often been used in the measurement of radiations. However, such detectors have the disadvantages of being bulky in size and heavy in weight. Recently, semiconductor radiation detectors are often used to attain lightweight, miniaturized units. In such a typical detector, a detection element is utilized which is formed by diffusing an impurity into an n-conductivity type single crystal silicon substrate to form a p-conductivity type layer with a pn-junction between the substrate and the p-conductivity type layer.

In the radiation measurement, the detection element is supplied with a high voltage of, for example, $-1,000$ V to form a depletion layer. When in this state a radiation is incident on the detection element, electron hole pairs are excited and according to the internal field the electrons are taken out from the substrate side, and the holes from the p-conductivity type layer side, thus obtaining an output corresponding to the incident radiation rate.

Such a semiconductor radiation detector, though small in size, has the following disadvantages:

(1) A low-noise detector and amplifier are required in the detection of radiations of low energy or low rate and a bias applying power source is also required, resulting in an expensive measuring device.
(2) The current leakage and dark current of the detection element need to be reduced, preventing easy manufacturing of the radiation detector.
(3) Since a high voltage needs to be applied to the detection element, there are involved great deterioration of characteristics, in particular, the lowering of withstand voltage.
(4) In operation, the detection element needs to be held in a vacuum container and cooled by a cooling medium such as liquid nitrogen. Thus, a cooling container, cooling medium and holding container are required, making the device bulky.
(5) A higher rate of noise is involved due to mechanical vibrations and shocks.
(6) Because the output is generated in the form of pulse waves, the device can not be worked if a high amount of radiation, for example, an X-ray radiation rate of 10 to 100 R/min is involved.

It is accordingly the object of this invention to provide a semiconductor radiation detector which is light in weight and low in cost, requires no external biasing and cooling, and permits a long-time measurement to be made even under a high amount of radiation without involving degeneration of the characteristics of the detector.

In one aspect of this invention there is provided a semiconductor radiation detector comprising a detector unit including a detection element having a single crystal silicon substrate with an impurity concentration of less than $1 \times 10^{14}$ cm$^{-3}$, a metal layer formed on one surface of the substrate to provide a surface barrier therebetween and an electrode layer formed on the other surface of the substrate, and an output circuit connected to the metal layer and electrode layer of the detection element to obtain an output corresponding to an amount of radiation incident on the detector unit.

In the semiconductor radiation detector of this invention a metal layer is formed on a single crystal silicon substrate with an impurity concentration of less than $10^{14}$ cm$^{-3}$ (specific resistance of above 300 Ω-cm) to form a surface barrier therebetween. This permits an amount of incident radiation to be detected without the necessity of applying a bias therebetween. The surface barrier may be formed either in direct contact with the metal layer and the single crystal silicon substrate or with a thin interposing film, such as a silicon oxide film (of a thickness of below 50 Å), left therebetween. If the impurity concentration of the single crystal silicon substrate is more than $10^{14}$ cm$^{-3}$. It would be impossible to detect a radiation of low energy or low rate with practically sufficient sensitivity. It is desirable that the carrier life time of the substrate be above 200 μsec, preferably above 500 μsec.

This invention will be described by way of example in connection with the accompanying drawings, in which:

FIG. 1 shows a semiconductor radiation detector according to a first embodiment of this invention;

FIGS. 2 and 3 are graphs showing a relation of a detection output to a radiation rate;

Figure 4:
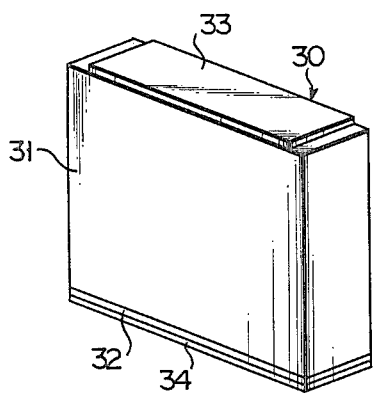
FIGS. 4 and 12 are perspective views showing modified forms of the detection element shown in FIG. 1.

Semiconductor radiation detectors or devices according to this invention will now be described by referring to the accompanying drawings.

In a detector shown in FIG. 1 a detection element 30 comprises a p-conductivity type, rectangular single crystal silicon substrate 31 having flat surfaces. The single crystal substrate 31 is formed to have a specific resistance of about 300 Ω-cm (an impurity concentration of $1 \times 10^{14}$ cm$^{-3}$) and a carrier life time of 200 μsec, preferably 500 μsec. Boron is diffused in high purity from one broader surface of the substrate 31 to form a thin p$^+$-conductivity type layer 32 therein. Aluminium is evaporated on the other broader surface of the substrate to form a metal layer 33. In this way, a surface barrier is formed between the substrate 31 and the metal layer 33. Before the formation of the metal layer on the surface of the substrate an oxide film may be completely removed, for example, by etching from the surface of the substrate. In this case, however, the oxide film may be left on the surface of the substrate, if its thickness is to the extent that no hindrance is given to the surface barrier. Gold is evaporated on the p$^+$-conductivity type layer 32 to form an ohmic electrode layer 34. The metal for the surface barrier and the metal for the ohmic electrode layer 32 are not restricted to aluminium and gold, respectively. The other metals such as titanium and nickel may also be used which are known in this field as submetals for forming such surface barrier and ohmic electrode. When, for example, an n-conductivity type single crystal silicon substrate is used, gold may be used for the formation of a surface barrier and aluminium for the formation of an ohmic electrode. For a metal such as aluminium which provides an ohmic contact if it is evaporated onto a single crystal silicon substrate, a high impurity concentration layer is not necessarily formed for ohmic contact. In the detection element 30 shown, the ohmic electrode 34 is connected to earth 35 and the metal layer 33 is connected to a sense amplifier 36. If radiations enter onto the detection element 30 from the direction as indicated by arrow A, B or C in FIG. 1, the detection element 30 detects an electromotive force induced therein. The sense amplifier 36 is constructed of an operational amplifier having a feedback resistor $10^7 \Omega$. The sense amplifier has its non-inverting input terminal grounded and its inverting input terminal connected to the metal layer 33 of the detection element. FIG. 2 shows a relation of a detection output to an incident radiation rate when a single crystal silicon substrate 31 having a rectangular shape of 17 mm×15 mm×2 mm and a carrier life time of about 500 μsec is used for the detection element. In FIG. 2, use is made, as a radiation, an X-ray having an energy of 70 KeV and the X-ray is incident onto the detection element in the directions A, B and C shown in FIG. 1. In the graph shown in FIG. 2 the output of the sense amplifier is plotted as the ordinate and the incident radiation rate as the abscissa. Lines A, B and C indicate the output characteristics of the X-ray which is incident onto the detection element in the directions A, B and C, respectively. If the radiation rate is within a range of 1 mR/min to 1 R/min, output voltages will vary in proportion to the radiation rate even when the X-ray is incident onto one side surface of the detection element 30 (i.e. in the direction A), onto the metal layer 33 of the detection element 30 (i.e. in the direction B), and onto the ohmic electrode layer 34 of the detection element 30 (i.e. in the direction C). This will be evident from FIG. 2. Even when the radiation rate is high i.e. of the order of 1 R/min to 100 R/min, output voltages substantially proportional to the radiation rate, though not shown in FIG. 2, are obtained without involving degeneration of the element characteristics. FIG. 3 shows for comparison a relation of a detection output to a radiation rate when a test is effected, in the same method as in FIG. 2, using for the detection element a single crystal silicon having a specific resistance of 50 Ω-cm and a carrier life time of about 100 μsec. It will be evident from FIG. 3 that the same output characteristic as in FIG. 2 is obtained for a greater radiation rate, that no rectilinear output variation is obtained at a radiation rate of below 500 R/min, and that no actual output value can be obtained at a rate of below 80 mR/min, since its value merely corresponds to a background count.

Figure 5:
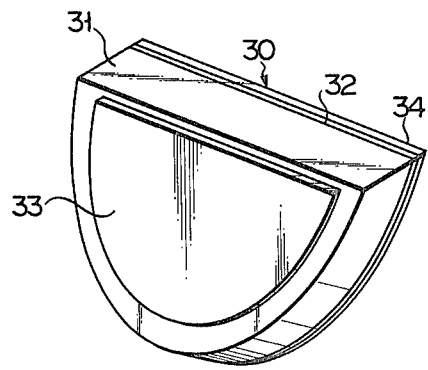
Figure 6:
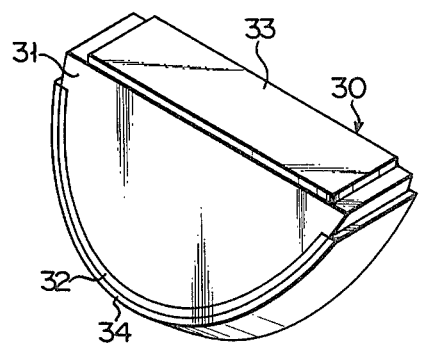

FIGS. 4 to 6 show modified forms of the detection element 30. The single crystal silicon substrate 31, metal layer 33 and ohmic electrode layer 34 take various configurations as shown in FIGS. 4 to 6. In the modification of FIG. 4 a metal layer 33 is formed on one narrower side surface of a rectangular silicon substrate 31 and an ohmic electrode layer 34 is formed on the opposite narrower side surface of the substrate 31. In the modification of FIG. 5 a metal layer 33 is formed on the broader side surface of a semicircular single crystal silicon substrate 31 and an ohmic electrode layer 34 is formed on the opposite broader side surface of the substrate 31. The detection element 31 of FIG. 6 comprises a semicircular single crystal silicon substrate 31, a metal layer 33 formed on a narrower flat side surface of the substrate 31, and an ohmic electrode layer 34 attached to the opposite semicircular side surface of the substrate 31.

Although in the above-mentioned embodiments or modifications the metal layer for the surface barrier is formed substantially over one whole surface of the single crystal silicon substrate, it may be formed in a pattern as will be described later.

Figure 7:
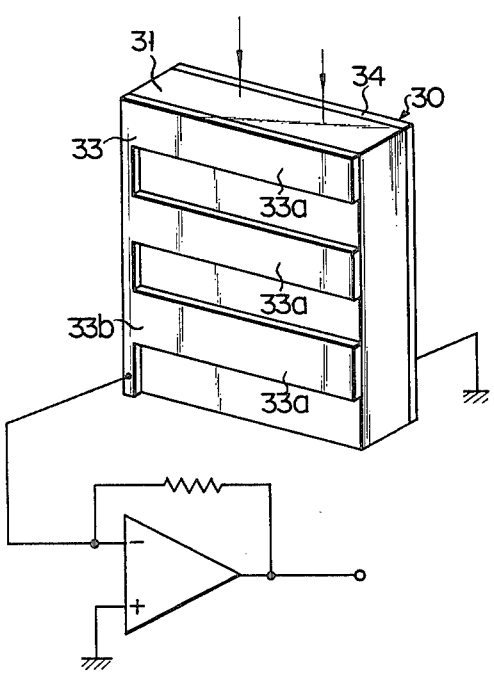

A detection element 30 shown in FIG. 7 has a metal layer 33 formed on one broader surface of a rectangular single crystal silicon substrate 31 and an ohmic electrode layer 34 formed on the opposite broader surface of the substrate. In such detection element 30 a radiation is directed to its side surface. The metal layer 33 has a digital configuration having a base portion 33b and a plurality of fingers 33a spaced apart predetermined intervals in the direction in which a radiation enters. In this arrangement, a surface barrier of digital configuration is formed between the metal layer 33 and the single crystal silicon substrate 31. A spacing between the fingers 33a of the metal layer 33, i.e. the width of strip-like surface areas left between the fingers 33a of the metal layer 33, is determined to be substantially equal to below a length $L=\sqrt{D\tau}$ (D: diffusion coefficient, τ: carrier lifetime), over which carriers are diffused.

The detection element shown in FIG. 7 can detect radiation with substantially the same sensitivity as in the FIG. 1 counterpart, though the surface barrier is not covered on one whole surface of the detection element. Furthermore, the area of the surface barrier is smaller than that of the counterpart of FIG. 1 and in consequence the leakage current and electrostatic capacity of the detection element can be made, for example, about half as small as those of the detection element of FIG. 1 and an S/N ratio be made higher than that of FIG. 1. The detection element can, therefore, detect a radiation of lower rate or low energy efficiently and with better accuracy. Moreover, the area of the surface barrier can be made smaller, thus attaining a high manufacturing yield and low cost.

Figure 8:
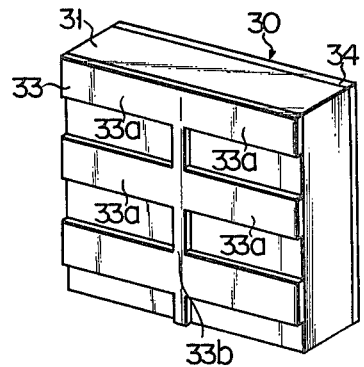

A detection element of FIG. 8 has a metal layer 33 formed on one broader surface of a substrate 31 and an ohmic electrode layer 34 evaporated on the other broader surface of the substrate. The metal layer 33 provides a surface barrier and has a base portion 33b and fingers 33a extending from both the sides of the base portion 33b.

Figure 9:
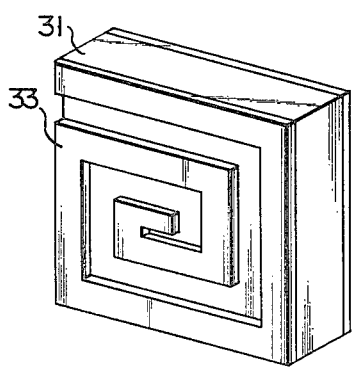

A detection element shown in FIG. 9 has a metal layer 33 formed on one broader surface of a substrate 31. The metal layer 33 provides a surface barrier and has a rectangular convolution.

Figure 10:
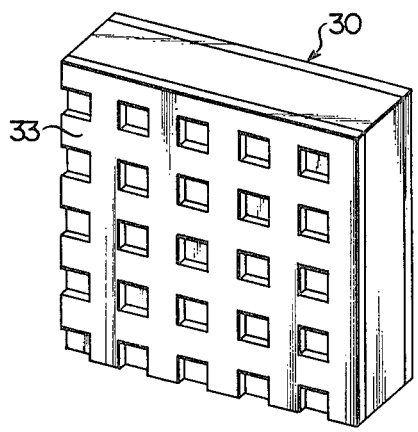

A detection element 30 of FIG. 10 has a lattice-like metal layer 33.

Figure 11:
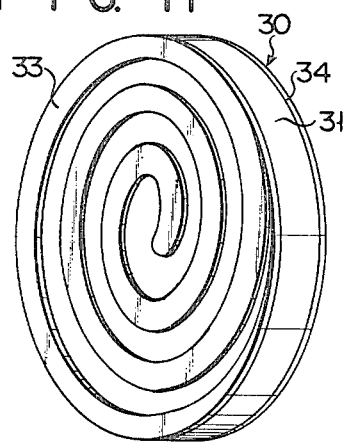

A detection element 30 of FIG. 11 has a circularly convoluted metal layer formed on one broader surface of a circular, single crystal silicon substrate 31 and an ohmic electrode layer 34 formed on the opposite broader surface of the substrate.

Figure 12:
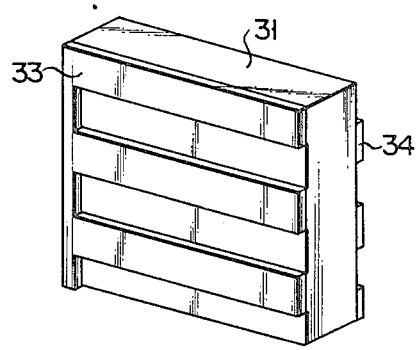

A detection element shown in FIG. 12 has a digital metal layer 33 formed on one broader surface of a single crystal silicon substrate 31. A digital ohmic electrode layer 34 is formed on the opposite broader surface of the substrate. The digital metal layer 33 is similar in configuration to the digital electrode layer 34. The configuration or the position of the digital electrode layer 34 may not necessarily in registry with that of the digital metal layer 33.

Although in the above-mentioned embodiments or modifications a single detection element is formed on a single crystal silicon substrate, a plurality of detection elements may be formed on a single substrate, or a plurality of one-element single crystal substrates be combined together.

Figure 13:
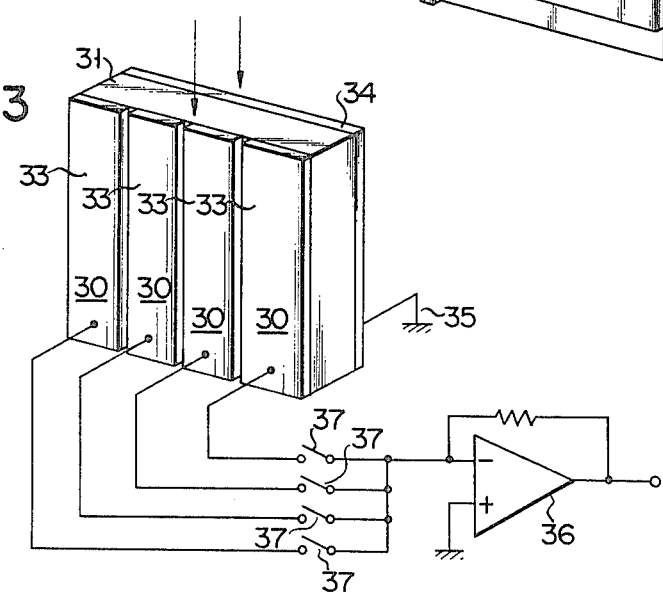
FIG. 13 shows a detection element of a semiconductor radiation detector according to a second embodiment of this invention.

In an embodiment shown in FIG. 13 a rectangular, single crystal silicon substrate 31 is used having a specific resistance of about 300 Ω-cm and a carrier life time of about 500 μsec. Four strip-like metal layers 33 are formed at predetermined intervals in the lateral direction thereof on one broader surface of the substrate 31. The metal layers 33 may be formed on the surface of the substrate by a selective evaporation with, for example, aluminium Alternatively, aluminium is evaporated on one whole surface of the substrate and then the Al-evaporated surface of the substrate is selectively etched to provide strip-like metal layers 33. A common ohmic electrode layer 34 made of, for example, gold is formed on the other broader surface of the substrate 31. The ohmic electrode layer 34 is connected to the earth 35. The metal layers 33 are connected through respective switches 37 to a common sense amplifier 36. In this embodiment, four detection elements 30 are provided having the four metal layers 33 mutually independently formed on the surface of the substrate 31.

The detection device shown in FIG. 13 receives a radiation, for example, from above i.e. as indicated by arrows in FIG. 13. In this case, outputs are selectively derived out from any of four detection elements so that an amount corresponding to the cross-section of the incident radiation is obtained. That is, the position and size of an effective portion of the radiation detector can be properly set by selectively opening and closing the four switches 37. The four detection elements are electrically isolated from each other and, even if some detection elements are driven, their detection outputs are not influenced by a leakage current and electrostatic capacity resulting from the remaining detection elements.

Figure 14:
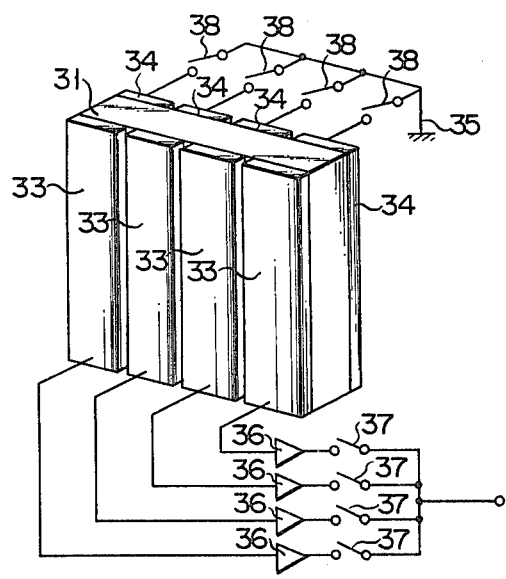
FIGS. 14 to 18 are perspective views showing various modified forms of the detection element shown in FIG. 13.

A detection device of FIG. 14 has four stripe-like metal layers 33 formed on one surface of a single crystal silicon substrate 31 and four ohmic electrode layers 34 mutually independently formed on the other surface of the substrate 31. The metal layers 33 are connected to sense amplifiers 36, respectively, and the outputs of the sense amplifiers are connected respectively through measuring switches 37 to a common output terminal. The ohmic electrode layers 34 are connected respectively through switches 38 to ground 35. The switches 38 on the sides of the ohmic electrode layers 34 are ganged with the corresponding measuring switches 37 on the sides of the metal layers 33. Such a detection device is less influenced by the leakage current and electrostatic capacity. In this embodiment, a plurality of ohmic electrode layers (four in this case) are provided which correspond in number to the metal layers. In consequence, the signals of the detection outputs are, after being added serially, derived out as an output.

Figure 15:
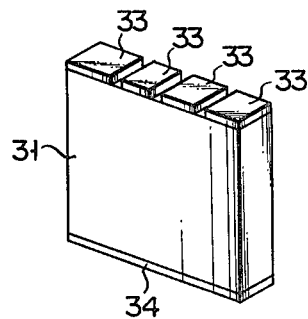

A detection device of FIG. 15 has four metal layers 33 mutually separately formed on one narrower surface of a rectangular, single crystal silicon substrate 31 and a common ohmic electrode layer 34 formed on the opposite narrower surface of the substrate 31.

Figure 16:
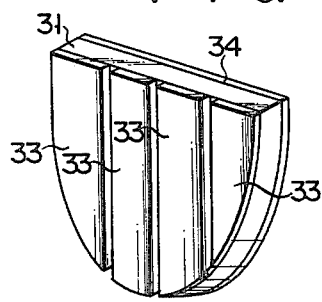

A detection device shown in FIG. 16 has four metal layers 33 formed on one surface of a semicircular substrate 31 and one ohmic electrode layer 34 formed on the other surface of the substrate 31.

Figure 17:
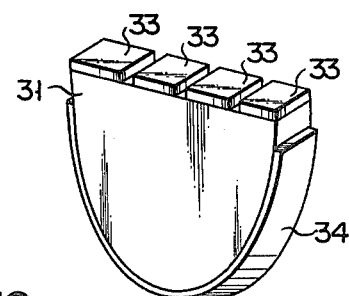

A detection device of FIG. 17 has four metal layers 33 formed on one flat side surface of a semicircular substrate 31 and an ohmic electrode layer 34 formed on the curved opposite surface of the substrate.

Figure 18:
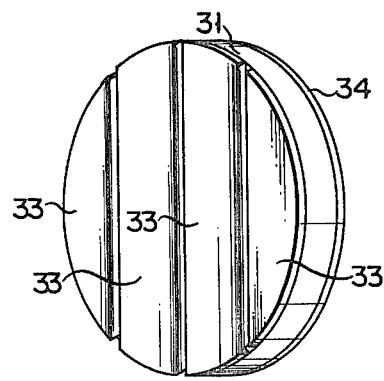

A detection device of FIG. 18 has four metal layers 33 formed on one surface of a disk-like, single crystal silicon substrate 31 and a common ohmic electrode layer 34 formed on the other surface of the substrate.

Although in the detection device of FIGS. 13 to 18 the four detection elements 30 are formed on the single crystal silicon substrate, this invention is not restricted to them. A proper number of detection elements can be selected according to the use of the detection device.

In the embodiments of FIGS. 19 to 24 a plurality of detection elements are bonded in side-by-side relation. In these embodiments the detection elements can be arranged not only in a single row, but also in a matrix array. The detection devices of FIGS. 19 to 24 can obtain the same advantage as in FIGS. 13 to 18 and also find a wide application.

Figure 19:
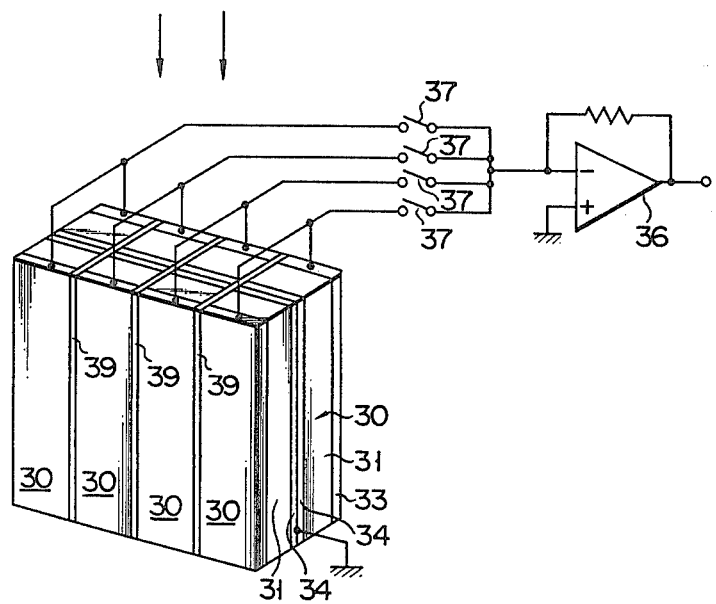
FIG. 19 shows the detection unit of a semiconductor radiation detector according to a third embodiment of this invention.

The device shown in FIG. 19 has a detection section having eight detection elements 30 arranged in a matrix array, four in a row and two in a column. The detection element 30 comprises a rectangular, bar-like, single crystal substrate 31, a metal layer 33 formed on one side surface of the substrate, and an ohmic electrode layer 34 formed on the opposite side surface of the substrate. The corresponding elements in each row have their ohmic electrodes 34 bonded in a back-to-back facing relation and the substrates 31 of elements in column are bonded in an end-to-end relation. The back-to-back facing elements 30 have their ohmic electrodes 34 electrically interconnected by an electroconductive adhesive, such as an electroconductive epoxy resin, indium solder and Au-Si alloy. The end-to-end facing elements 30 are mutually electrically isolated by a known insulating adhesive 39. In consequence, a pair of back-to-back facing elements 30 constitute one set and thus four sets of detection elements are arranged. The ohmic electrode layer 34 of each of the set is grounded. The metal layers 33 of the respective sets are connected respectively through switches 37 to a common sense amplifier 36.

Figure 20:
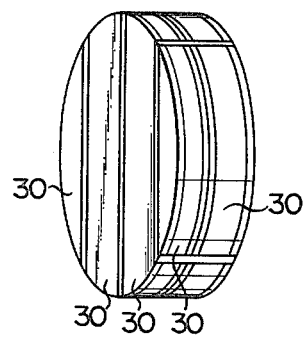
FIGS. 20 to 22 are perspective views showing various forms of the detection unit of FIG. 19.
Figure 21:
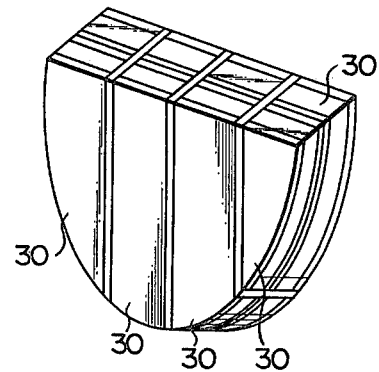

In the detection devices of FIGS. 20 and 21, eight detection elements 30 are mutually bonded, as in FIG. 19, to provide circular and semicircular units, respectively.

Figure 22:
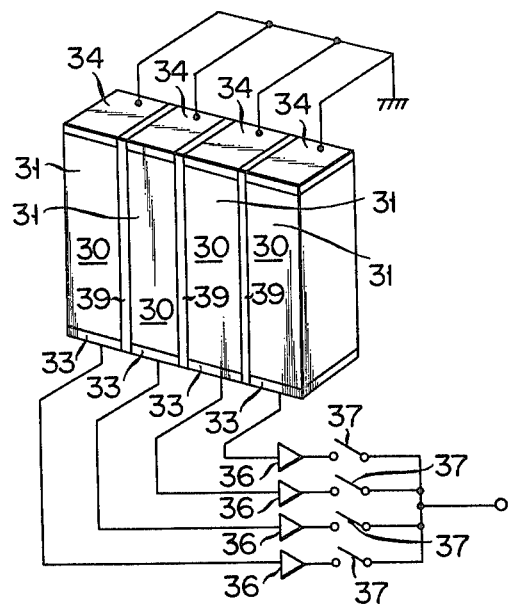
Figure 23:
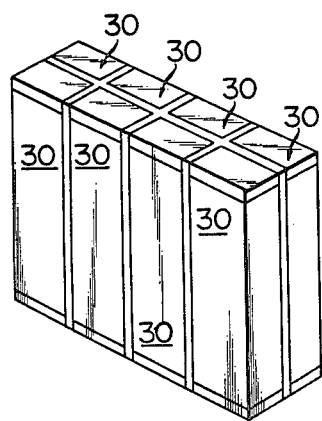
FIG. 23 is a view showing the detection unit of a semiconductor radiation detector according to a fourth embodiment of this invention.
Figure 24:
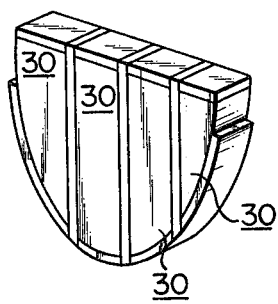
FIG. 24 is a perspective view showing a modified form of the detection unit shown in FIG. 23.

In the detection device of FIG. 22, four detection elements 30 are mutually bonded, by an insulating adhesive, in an end-to-end relation to provide a detection unit. The detection element 30 has an ohmic electrode layer 34 on the top surface of a tetragonal, single crystal silicon substrate 31 and a metal layer 33 formed on the bottom surface of the substrate. The ohmic electrode layers 34 of the elements 30 are grounded and the metal layers of the elements are connected respectively through sense amplifiers 36 and switches 37 to a common output terminal. Two such detection units may be arranged in a matrix array as shown in FIG. 23. In this case, the outputs of their elements are drived out as in the detection unit shown in FIG. 23. The detection elements of FIG. 22 may be so configured as to provide a semicircular unit as shown in FIG. 24.

Explanation will now be made of various mechanisms suited to accommodate the above-mentioned detection element or detection device.

Figure 25:
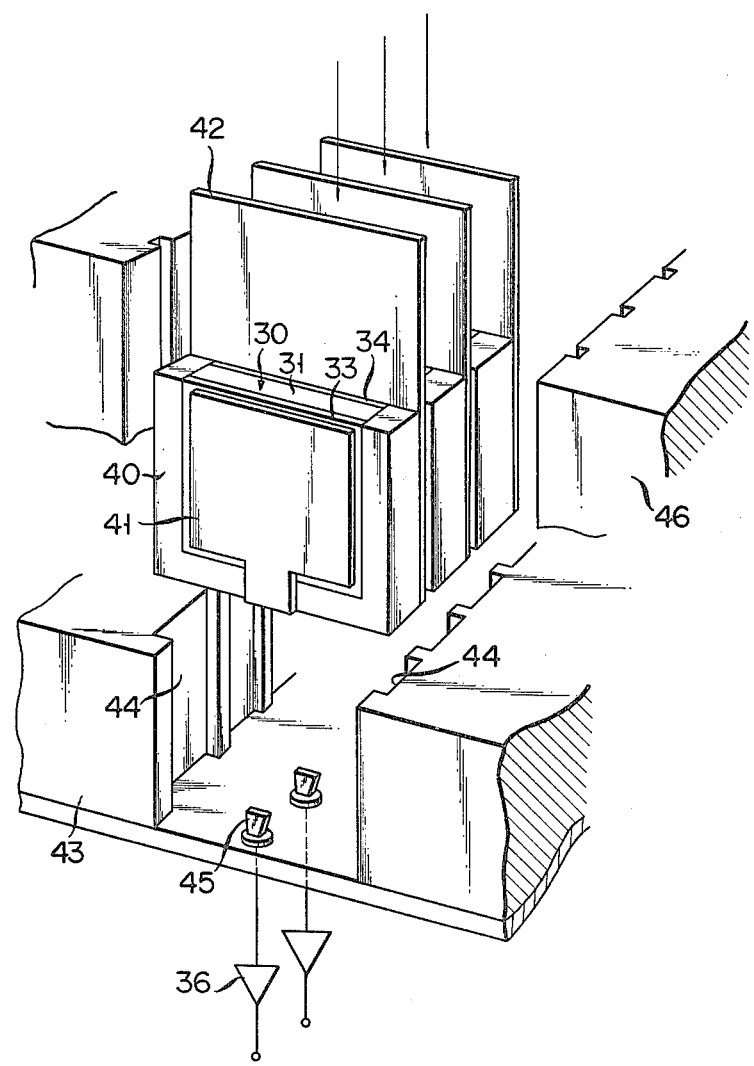
FIGS. 25 and 28 are perspective views each showing a device according to this invention, in which detection elements are incorporated.

A mechanism of FIG. 25 is suitable for a detection element 30 having, as shown in FIG. 1, a rectangular, plate-like, single crystal silicon substrate 31 on which a metal layer 33 and ohmic electrode layer 34 are formed one at each broader surface of the substrate. The detection element 30 is received in a recess of a rectangular frame-like mount 40 having a thickness equal to that of the detection element 30, and the recess of the mount 40 is open at its upper end. The mount 40 is made of an insulating member such as a synthetic resin and the member 30 is adhesively bonded at its three sides to the inner surface of the mount 40 such that the top side of the member 30 is left unbonded and exposed. The upper end surfaces of the mount 40 is so dimensioned that it is flush with the top surface of the element 30. A radiation enters toward the top surface of the member 30. An output terminal electrode layer 41 is formed on the metal layer 33 of the element 30 and has a projection downwardly extending along the surface of the mount 40. A ground terminal electrode layer 42 of plate shape is attached to the ohmic electrode layer 34 of the element 30. The ground terminal electrode layer 42 covers up one whole surface of the mount 40 and further extends upwardly. In this way, a detector unit is provided. A plurality of such detector units are arranged, as shown in FIG. 25, with their top surfaces oriented in a direction in which a radiation enters. The detector units are received in a metal housing 43 to provide a multichannel type radiation detector. Pairs of guide grooves 44 are provided on the oppositely facing inner surfaces of the housing 43 so that each detector unit can be slidably inserted down into the paired grooves 44. This assures a positive positioning of the detector unit. Connectors 45 extend through the bottom wall of the housing 43 and are fixed there. The connector 45 is electrically insulated from the housing 43. The downwardly extending projection of the output terminal electrode layer 41 of each detector unit is contacted with the connector 45 for electrical connection. The connector 45 is connected to a corresponding sense amplifier 36. The ground terminal electrode layer 42 of the detector unit is grounded by the housing 43, when the detector unit is inserted in the oppositely facing grooves of the housing so that the layer 42 is contacted with the housing. The ground terminal electrode layer 42 is made of Al, Ti, W or Mo and both the sides of the upwardly extending portion of the ground terminal electrode layer 42 are held by supporting walls 46. In this way, a collimator is provided. The above-mentioned detector eliminates the need for an electrode connection technique such as wire bonding and soldering, thus assuring enhanced stability and reliance. Furthermore, the detector unit can be readily manufactured and assembled, in high yield and at low cost. Since the detection element and mount are of the same thickness, the thickness of the detector unit per se can be made smaller. The detector units are fitted into the respective oppositely facing paired grooves of the housing and accurately oriented in a narrow spacing, thus assuring a high positional resolution.

Figure 26:
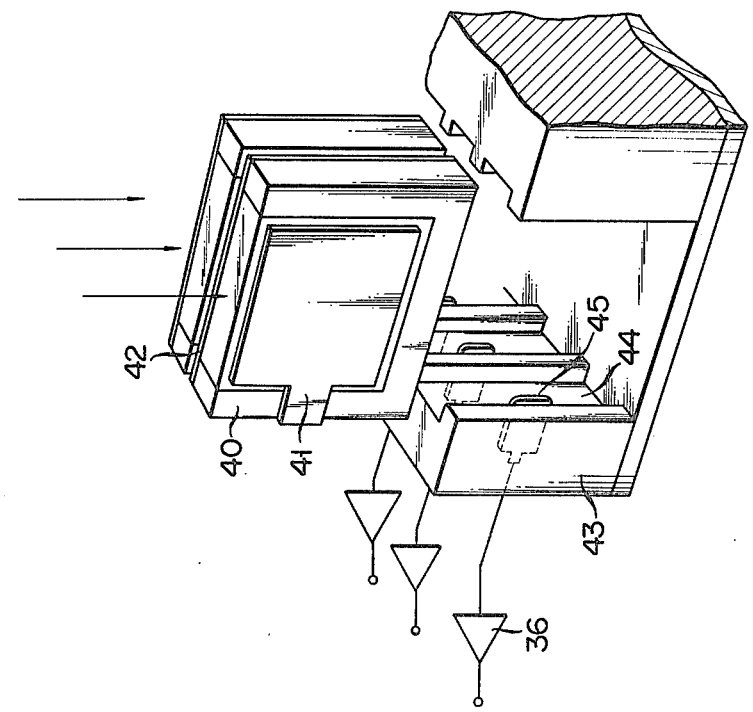

In the detector units shown in FIG. 26 the output terminal electrode layer 41 has a projection at one side, and a terminal 45 connected to a corresponding sense amplifier 36 extends out into a corresponding guide groove 44 of a housing 43. When the detector unit is inserted into corresponding, oppositely facing paired guide grooves of the housing, the projection of the output terminal electrode layer 41 is brought into pressure contact with the terminal. In this embodiment, a ground terminal electrode layer 42 does not extend upwardly and thus no collimator is provided. In the embodiment shown in FIG. 27 each of detector units comprises a plurality of detector elements 30 as shown in FIG. 13. Output terminal electrode layers 41 are attached to metal layers 33 of the detection elements, respectively. The projection of each electrode layer 41 extends along the side surface of a mount 40. Four terminals 45 extend through the bottom wall of a housing 43 such that they are arranged, at predetermined intervals, between a pair of oppositely facing guide grooves of the housing 43. Outside the housing 43, the four terminals 45 are connected respectively through switches 37 to a common sense amplifier 36. When the detector unit is inserted into the housing 43 along the paired guide grooves, the projections of the output terminal electrode layers 41 are contacted with the terminals 45 for electrical connection.

Figure 28:
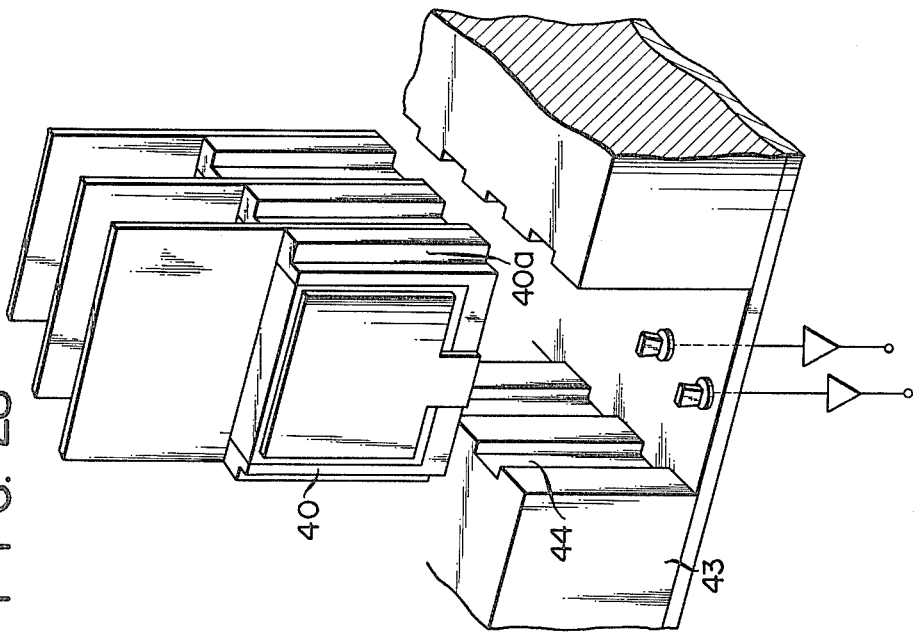

In the embodiment shown in FIG. 28 a mount 40 for a detector unit is equal in thickness to the detector unit and has a mount 40 with a stepped portion 40a, vertically extending portion at each side. The stepped portion of each detector unit is inserted into a pair of oppositely facing guide grooves 44 of a housing 43 and thus the detector unit is fitted into the housing 43. The detector units can be closely received in the housing 43 by using the corresponding mounts 40.

Although in the above-mentioned embodiments the detector element for the detector unit is one, four and eight in numbers, this invention is not restricted thereto. The number of detector elements may be changed according to the use of the detector unit. The sense amplifier is not necessarily required. Parts having a suitable amplification function may be used in combination.

Said output circuit may be constructed by a biasless circuit which applies no bias across the detector element.

Although the housing is made of electrical conductive material in the embodiments described above, it may be constructed by insulating material. In this case the ohmic electrode layer and metal layer are respectively connected to electric terminals penetrating through the housing.

What we claim is:

1. A semiconductor radiation detector comprising a detector unit including a detection element having a single crystal silicon substrate with an impurity concentration of less than $1 \times 10^{14}$ cm$^{-3}$, a metal layer formed on one surface of the substrate to provide a surface barrier between the metal layer and the substrate, the surface barrier having a rectifying characteristic, and an electrode layer formed on the other surface of the substrate, and an output circuit connected to the metal layer and electrode layer of the detection element to obtain an output corresponding to an amount of X-ray or gamma ray radiation incident on the detector unit without the application of a bias across the detection element.

2. A semiconductor radiation detector according to claim 1, in which said metal layer is contacted directly with said single crystal silicon substrate.

3. A semiconductor radiation detector according to claim 1, in which said metal layer is attached to said single crystal silicon substrate with a silicon oxide film therebetween, said silicon oxide film having a thickness of below 50Å.

4. A semiconductor radiation detector according to claim 1, in which said single crystal silicon substrate is a rectangular shape and has a surface on which said metal layer is formed, and an opposite surface on which said electrode layer is formed.

5. A semiconductor radiation detector according to claim 4, in which said single crystal silicon substrate has a radiation incident surface which is present between said metal layer and said electrode layer.

6. A semiconductor radiation detector according to claim 1, in which said output circuit has a sense amplifier for amplifying an output from said detection element.

7. A semiconductor radiation detector according to claim 1, in which said detector unit includes a plurality of detection elements arranged in side-by-side relation and electrically insulated from each other, and said output circuit includes sense amplifiers connected to the detection elements respectively and switches adapted to operate the respective detection elements in an ON-OFF fashion.

8. A semiconductor radiation detector according to claim 7, in which said detection elements have respective metal layers formed at predetermined intervals on said single crystal substrate so that surface barriers are each formed between the substrate and the metal layer.

9. A semiconductor radiation detector according to claim 7, in which said plurality of detection elements have a plurality of single crystal silicon substrates arranged in a row in side-by-side relation, respective metal layers each formed on one surface of the substrate to form a surface barrier therebetween, respective electrode layers each formed on an opposite surface of the substrate, and an electrically insulating adhesive bonded between the respective detection elements to electrically insulate the detection elements from each other.

10. A semiconductor radiation detector according to claim 1, in which said detection element comprises at least four detection elements having respective single crystal silicon substrates arranged in first and second rows in side-by-side relation, respective metal layers each formed on one surface of the substrate to provide a surface barrier therebetween, respective electrode layers each formed on an opposite surface of the substrate, and an electrically insulating adhesive bonded between the respective substrates, in which the electrode layers of the substrates in said first row are bonded in back-to-back relation to the electrode layers of the substrates in said second row.

11. A semiconductor radiation detector according to claim 1, further including a housing in which a plurality of detector units are located at predetermined intervals, and a plurality of terminals extending through the housing and electrically connected to the respective detector units.

12. A semiconductor radiation detector according to claim 11, in which said housing has an electroconductive property and is electrically connected to one of the electrode layer and metal layer of detection elements of said detection sections, and said terminals are fixed in a manner to be electrically insulated from the housing and electrically connected to the other layer of the detection element which is not electrically connected to the housing.

13. A semiconductor radiation detector according to claim 12, in which the electrode layers of said detection elements all extend in a radiation incident direction to provide a collimator.

* * * * *